United States Patent [19]

Masuda

[11] Patent Number: 5,111,061
[45] Date of Patent: May 5, 1992

[54] DRIVING CIRCUIT FOR SEMICONDUCTOR ELEMENT

[75] Inventor: Hiroyuki Masuda, Nagasaki, Japan

[73] Assignee: Mitsubishi Denki Kabushiki Kaisha, Tokyo, Japan

[21] Appl. No.: 704,593

[22] Filed: May 23, 1991

[30] Foreign Application Priority Data

May 25, 1990 [JP] Japan .................................. 2-136861

[51] Int. Cl.⁵ ...................... H03K 17/60; H03K 17/72
[52] U.S. Cl. .................................. 307/254; 307/633; 307/253
[58] Field of Search ............... 307/633, 253, 254, 300; 323/289, 351

[56] References Cited

U.S. PATENT DOCUMENTS

| | | | |
|---|---|---|---|
| 4,117,350 | 9/1978 | Kalfus et al. ........................ | 307/633 |
| 4,642,483 | 2/1987 | Tomita ............................ | 307/633 X |
| 4,890,009 | 12/1989 | Miyazaki et al. ................ | 307/300 X |
| 4,996,444 | 2/1991 | Thomas et al. ...................... | 307/269 |

FOREIGN PATENT DOCUMENTS 59-181824 10/1984 Japan .
62-291577 12/1987 Japan .

Primary Examiner—John S. Heyman
Assistant Examiner—Toan Tran
Attorney, Agent, or Firm—Burns, Doane, Swecker & Mathis

[57] ABSTRACT

A driving circuit for a semiconductor element to be controlled by a first and second transistors being connected in series to selectively take ON-operation responsive to application of forward of reverse bias, comprises a reverse bias stop judging circuit having a detecting circuit for detecting reverse bias current being connected in a circuit which connects the second transistor with the semiconductor element to be controlled, a level detecting means for detecting that reverse bias current continuously exceeds a set level for a predetermined time, according to the detected result of the detecting circuit, means for temporarily stopping application of reverse bias to the semiconductor element to be controlled according to the detected output of the level detecting means, and means for restarting application of reverse bias after a predetermined time.

2 Claims, 6 Drawing Sheets

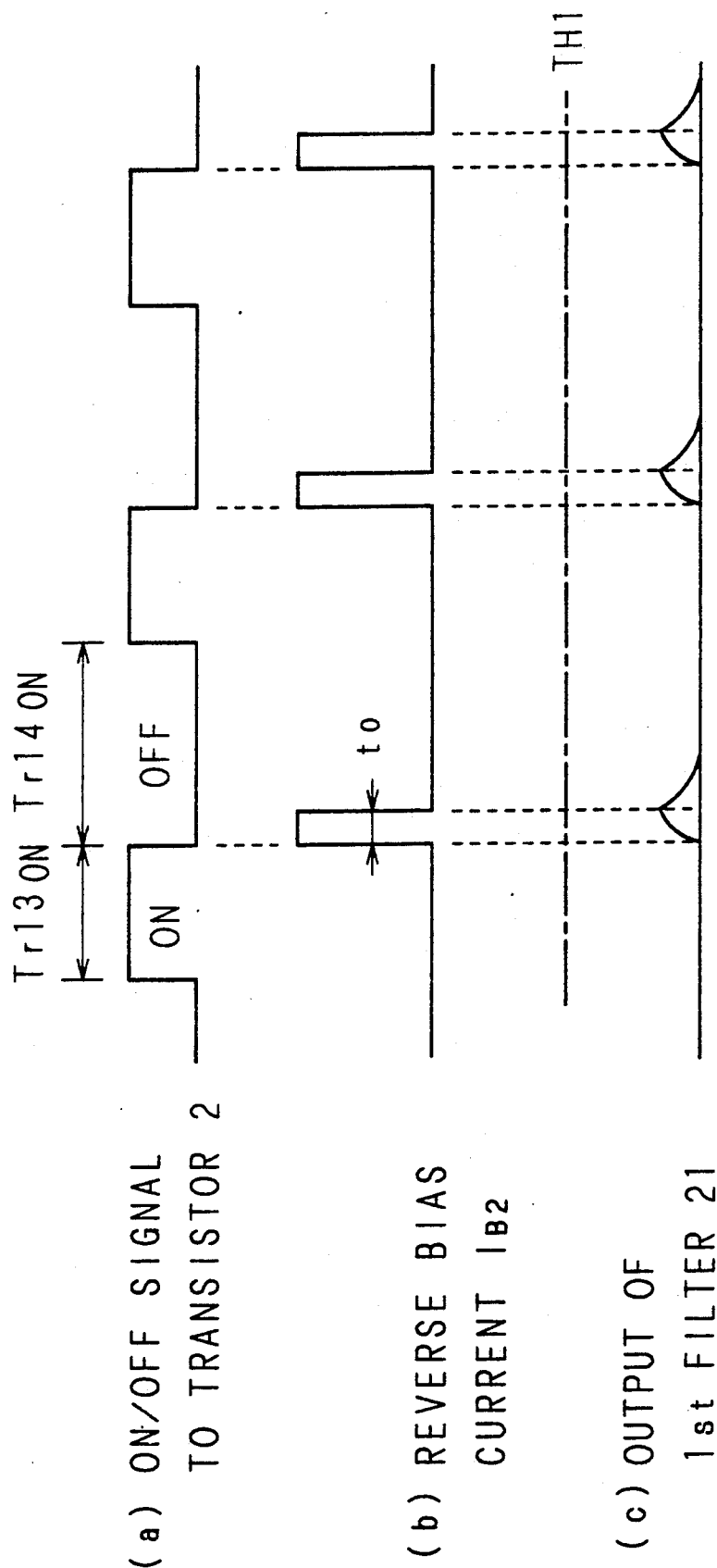

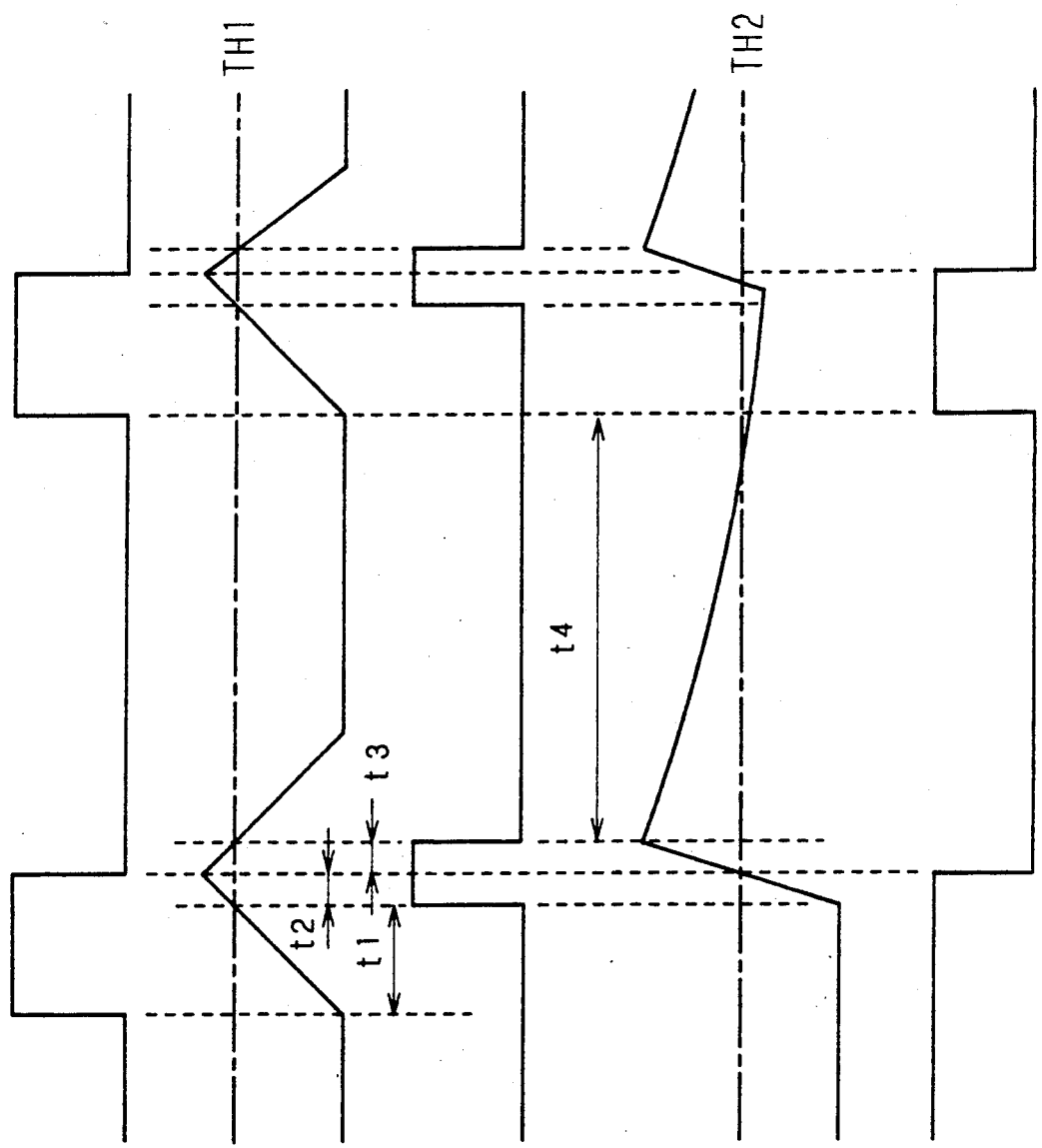

DRIVING CIRCUIT FOR SEMICONDUCTOR ELEMENT

BACKGROUND OF THE INVENTION

1. Field of the Invention

This invention relates to a driving circuit for an electric power semiconductor element such as a transistor, more particularly to a driving circuit for a semiconductor element capable of avoiding burnout due to reverse bias current.

2. Description of Related Art

FIG. 1 is a circuit diagram reported on p. 44 in "Application Manual for Inverter" published by "Denski Shoin" (Sept. 7, 1985).

In FIG. 1, reference numeral 2 designates a transistor being a semiconductor element which is driven, that is, to be controlled, and reference numberal 3 designates a driving circuit for the transistor.

The construction of the driving circuit 3 is as follows.

Reference numeral 15 designates a photocoupler which photoelectric-transfers an inputted signal from the exterior by converting it into a photo signal by a light emitting element 15a and receives an electric signal after the photo signal is converted into the electric signal by a light receiving element 15b. With an output terminal of this photocoupler 15, respective bases of an NPN transistor 13 being a first transistor and of a PNP transistor 14 being a second transistor are connected.

Respective collectors of the first and second transistors 13, 14 are connected with a positive electrode of a first power source 11 and a negative electrode of a second power source 12 being D.C. power sources connected in series respectively through respective resistances 17, 18.

Reference numeral 16 designaltes a resistance being connected between the base of the first transistor 13 and the first power source 11. And the base of the transistor 2 to be controlled is connected with a series node of the first transistor 13 and the second transistor 14, the collector of the same being connected with an exterior power source (not shown).

Next, explanation will be made on the operation of such a conventional driving circuit for a semiconductor element.

In the case, for example, where a signal from the exterior is not inputted to the light emitting element 15a of the photocoupler 15, accordingly, the light receiving element 15b does not receive a photo signal, that is, the photocoupler 15 is in the off state, the first transistor 13 is conducted as base current is supplied through the resistance 16. As a result, as a circuit is formed in the order of the first power source 11, resistance 17, collector and emitter of the first transistor 13, base and emitter of the transistor 2 to be controlled, first power source 11 to flow forward bias current to the transistor 2 to be controlled, the transistor 2 to be controlled is conducted.

On the other hand, when the photocoupler 15 is in the on state, as the second transistor is forward-biased to be conducted, a circuit is formed in the order of the second power source 12, emitter and base of the transistor 2 to be controlled, emitter and collector of the second transistor 14, resistance 18, second power source 12 to flow reverse bias current to the transistor 2 to be controlled, thereby the transistor 2 to be controlled being unconducted.

Here, the voltage of the first power source 11 is designated by $V_{B1}$, resistance value of the resistance 17 $R_{17}$, and voltage between the base and emitter of the transistor 2 to be controlled $V_{BE}$, forward bias current $I_{B1}$ is given by the following equation (1).

$$I_{B1}=(V_{B1}-V_{BE})/R_{17} \tag{1}$$

In addition, the voltage of the second power source 12 is designated by $V_{B2}$, resistance value of the resistance 18 $R_{18}$, and voltage between the emitter and base $V_{EB}$, reverse bias current $I_{B2}$ is given by the following equation (2).

$$I_{B2}=(V_{B2}-V_{EB})/R_{18} \tag{2}$$

By the way, in the conventional driving circuit for a semiconductor element, in the case where the output of the driving circuit 3 is short-circuited due to miswiring of the transistor 2 to be controlled, there was a problem that the first transistor 13 and the second transistor 14 are easily burnt due to the short-circuited current. Especially, at the reverse bias side, after the transistor 2 to be controlled is in the non-conductive state, large current is required to be flown in order to absorb storage carrier even for a short time (about 1 to 20 μm sec.). Therefore, the resistance value $R_{18}$ of the resistance 18 is required to be designed small, which makes abnormal current at the time of short-circuiting to be large, thereby burnout of the first transistor 13 and the second transistor 14 are easily caused and protection of the driving circuit 3 are not carried out satisfactorily.

SUMMARY OF THE INVENTION

The present invention has been devised in view of the above-mentioned circumstances, and the object thereof is to provide a driving circuit for a semiconductor element which does not cause a problem such as burnout even in the case where an output of a driving circuit is short-circuited due to miswiring of a semiconductor element to be controlled.

The driving circuit for a semiconductor element of the invention which is provided with a first and a second transistor connected in series to selectively take ON-state corresponding to application of forward or reverse bias, a first power source supply D.C. electric power into the first transistor and a second electric power supplying D.C. electric power to the second transistor, and which drives the semiconductor element to be controlled whose base is connected with a series node of the first transistor and the second transistor and is applied with forward bias current and whose emitter is connected with a series node of the first power source and the second power source and is applied with reverse bias current, comprising a reverse bias stop judging circuit having: a detecting circuit for detecting reverse bias current connected within a circuit for connecting the second transistor with the semiconductor element to be controlled; level detecting means for detecting that reverse bias current continuously exceeds a set level for a predetermined time according to detectionn output of the level detecting means; and a means for restarting applying of reverse bias after a predetermined time.

The above and further objects and features of the invention will more fully be apparent from the following detailed description with accompanying drawings.

BRIEF DESCRIPTION OF THE DRAWING

FIG. 5 is a timing chart showing waveforms of respective signals of a driving circuit for a semiconductor element of the invention at the time of normal operation, and FIG. 6 is also a timing chart at a time when reverse bias current is generated.

DESCRIPTION OF THE PREFERRED EMBODIMENTS

Figure 1:
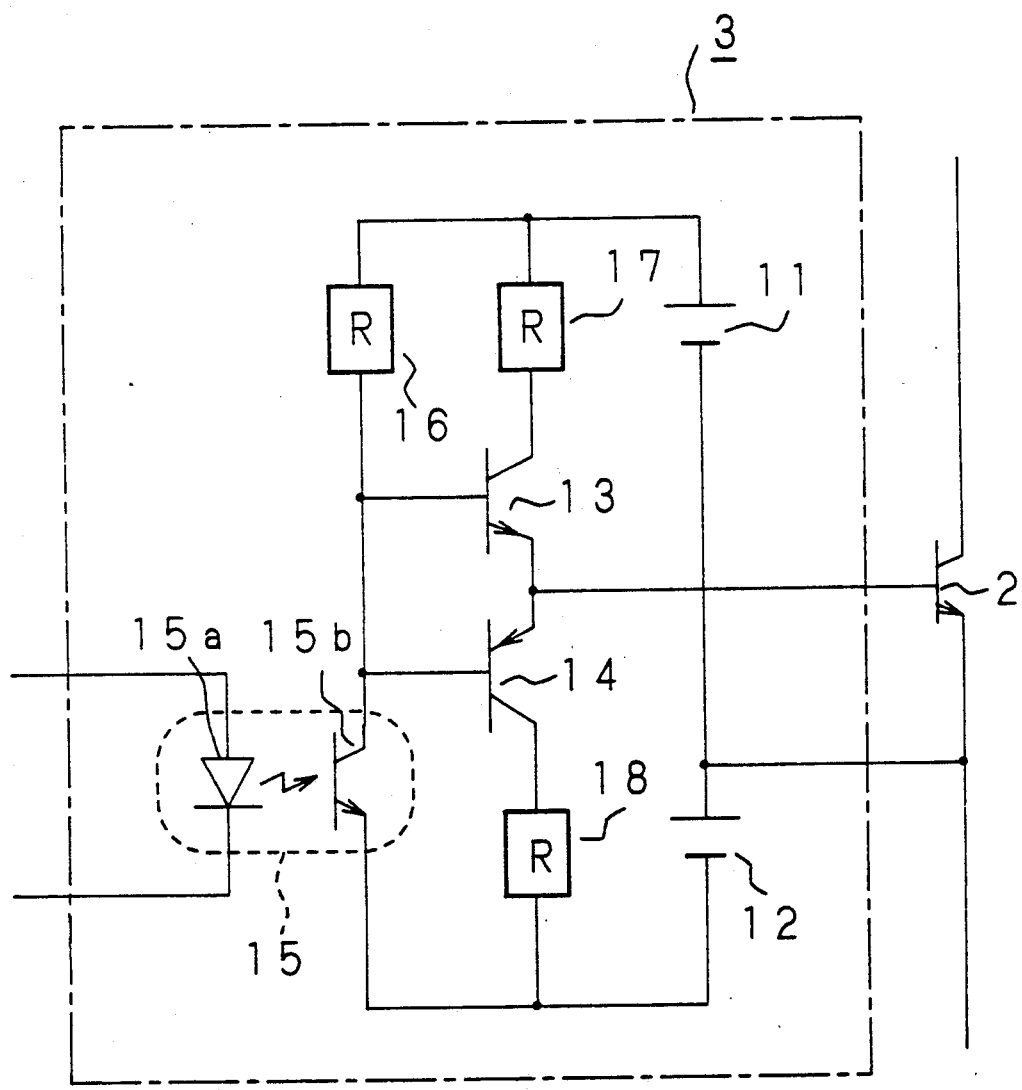
FIG. 1 is a circuit diagram showing a construction of a conventional driving circuit for a semiconductor element.

In the following, description of the invention will be made referring to the drawings showing the embodiments thereof.

Figure 2:
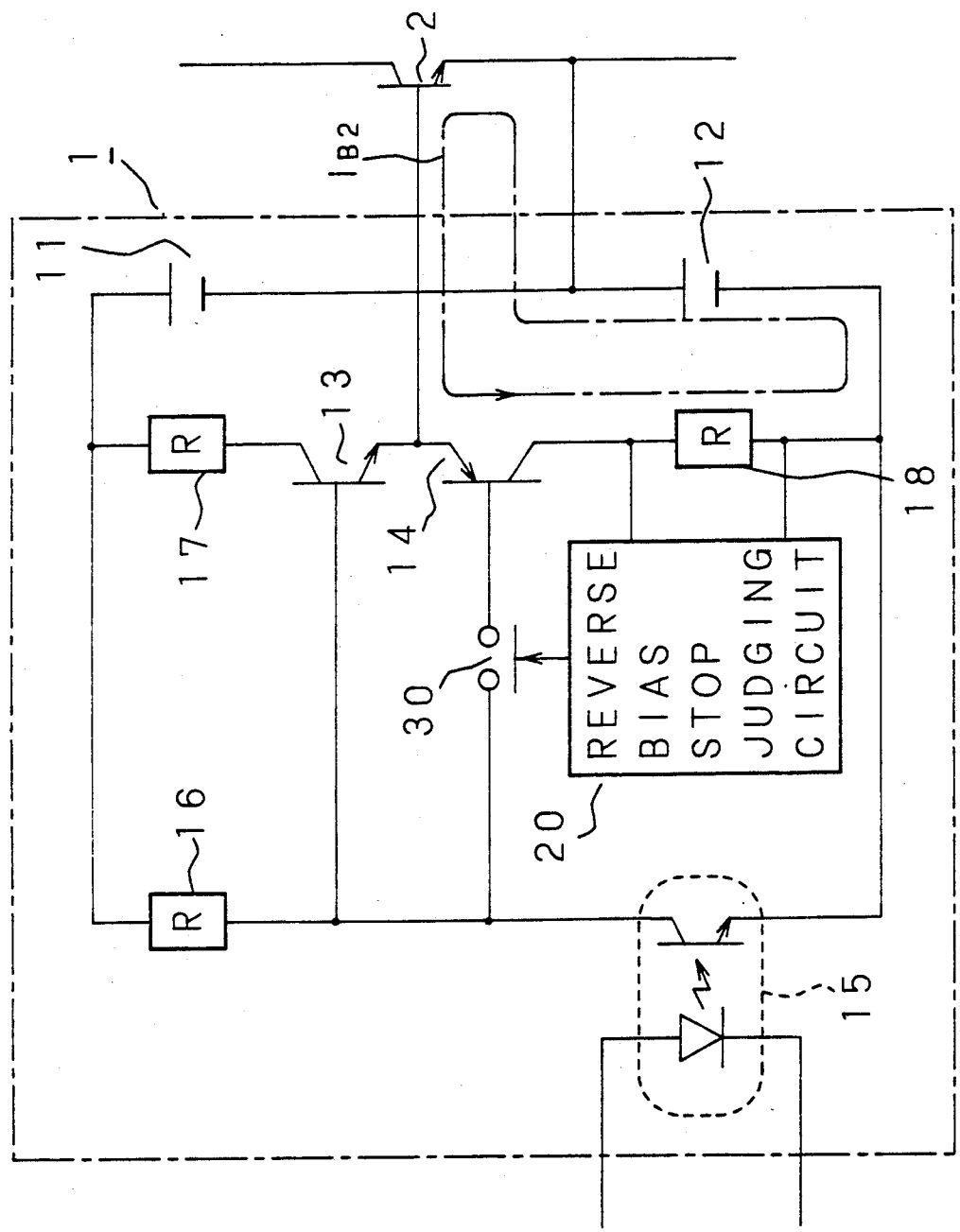
FIG. 2 is a circuit diagram showing an outline construction of a driving circuit for a semiconductor element of the invention.

FIG. 2 is a circuit diagram showing an outline construction of a driving circuit for a semiconductor element of the invention.

In FIG. 2, reference numeral 1 designates a driving circuit for a semiconductor element related to the invention, and numeral 20 designates a reverse bias stop judging circuit which characterizes the invention and is provided within the circuit. Numeral 30 symbolically designates a switch which is made ON/OFF according to an output of the reverse bias stop judging circuit 20, however, it is included in the reverse bias step judging circuit 20 in the construction of the actual circuit, to be described later. The other construction elements are basically same as the ones in the conventional circuit shown in FIG. 1.

Figure 3:
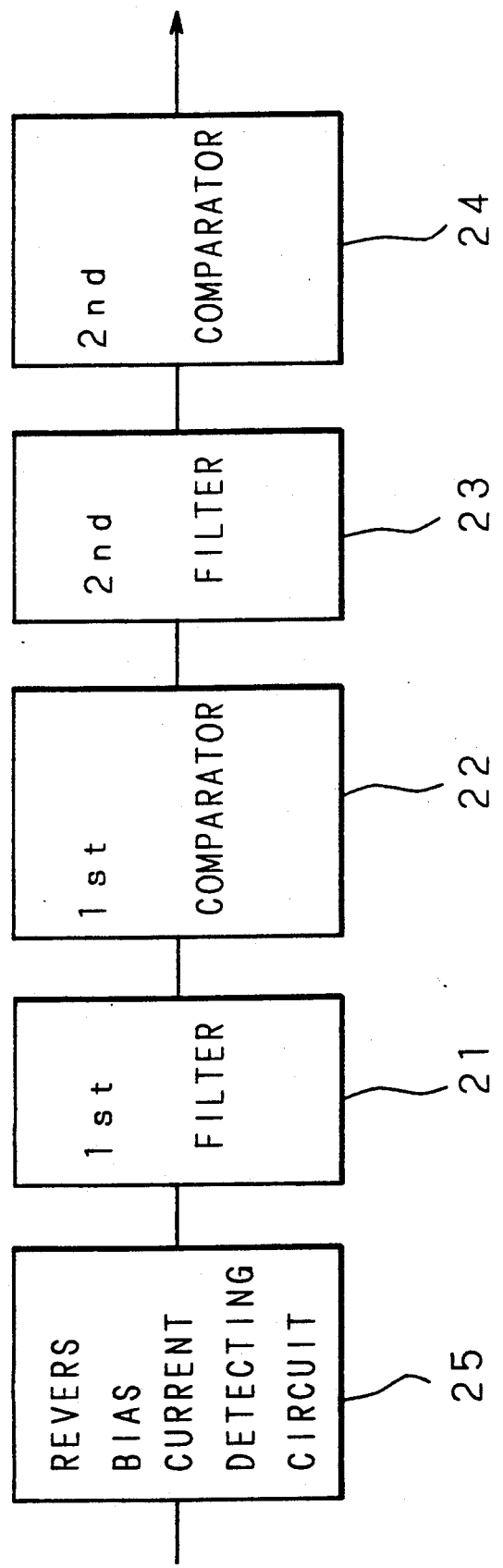
FIG. 3 is a block diagram showing a functional construction of a reverse bias stop judging circuit characterizing the invention.

FIG. 3 is a block diagram showing a functional construction of the reverse bias stop judging circuit 20.

In FIG. 3, reference numeral 25 designates a reverse bias current detecting circuit. To be described later, the reverse bias current detecting circuit 25, in the case where reverse bias current is generated, detects it and outputs a detecting signal of a predetermined level. Numeral 21 designates a first filter which filters and outputs the detecting signal of the reverse bias current detecting circuit 25 according to a discharge time constant which have been set in advance. Numeral 22 is a first comparator which outputs a predetermined signal in the case where the output of the first filter 21 is more than predetermined first threshold TH1. Numeral 23 is a second filter which filters and outputs the output of the first comparator 22 according to a discharge time constant which has been set in advance. Numeral 24 designates a second comparator which outputs a predetermined signal in the case where the output of the second filter 23 is more than a predetermined second threshold TH2.

Figure 4:
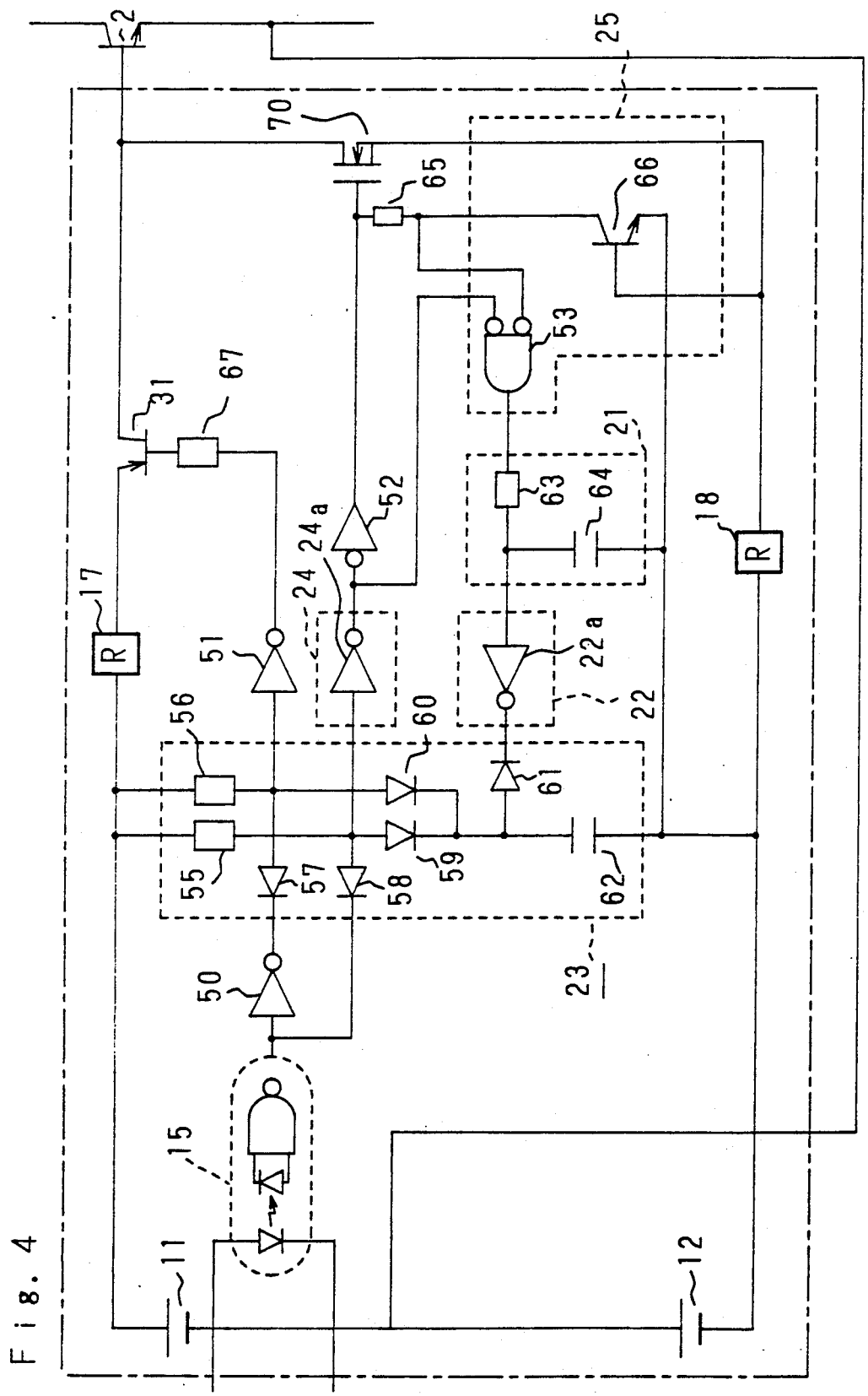
FIG. 4 is a circuit diagram showing a detailed construction of a driving circuit for a semiconductor element of the invention.

FIG. 4 is a detailed circuit diagram showing a concrete embodiment of schematic circuit diagram of a driving circuit for a semiconductor element of the invention shown in FIG. 3.

In FIG. 4, the above-mentioned first filter 21 consists of a resistance 63 and capacitor 64, the first comparator 22 consists of an inverter 22a, the second filter 23 consists of resistances 55 and 56, diodes 57 through 61 and capacitor 62, and the reverse bias current detecting circuit 25 consists of a transistor 66 and a NOR gate 53.

In addition, numeral 31 is a bipolar transistor which corresponds to the first transistor 13 in FIG. 2. The emitter of the bipolar transistor 31 is connected with a first power source 11 through a resistance 17, the collector of the same with a base of a transistor 2 to be controlled, and the base with the second filter 23 through a resistance 67 and an inverter 51, respectively.

Numeral 70 designates a MOS type electric field effect transistor which corresponds to a second transistor 14 in FIG. 2.

Numeral 65 designates a resistance, one end thereof being connected with the base of the electric field effect transistor 70, and the other end thereof with one input terminal of the NOR gate and the collector of the transistor 66 of the reverse bias current detecting circuit 25.

To the other input of the NOR gate 53, the output of the second comparator 24 is inputted, and the output therefrom is given to an inverter 22a of the first comparator 22 through the resistance 63 of the first filter 21. In addition, the emitter of the transistor 66 is connected with a second power source 12, and the base thereof with the emitter of the electric field effect transistor 70.

One end of the capacitor 64 of the first filter 21 is connected with a portion between the resistance 63 of the first filter 21 and the inverter 22a, and the other end thereof with the second power source 12.

The output of the inverter 22a is connected with one end of the diode 61 of the second filter 23.

The other end of the diode 61 is connected with respective one ends of the diodes 59 and 60, and moreover with one end of the capacitor 62.

The other end of the diode 59 is connected with an output of a photocoupler 15 through the diode 58, and with the first power source 11 through the resistance 55, and moreover with the inverter 24a of the second comparator 24.

The other end of the diode 60 is connected with the output of the photocoupler 15 through the diode 57 and an inverter 50, and with the first power source 11 through the resistance 56 respectively, and moreover with the base of the bipolar transistor 31 through the inverter 51 and resistance 67.

In addition, the other end of the capacitor 62 is connected with the second power source 12.

The output of the inverter 24a of the second comparator 24 is connected with the other input terminal of the NOR gate 53 of the reverse bias current detecting circuit 25, and also with the base of the electric field effect transistor 70 through an inverter 52.

Next, explanation will be given on the operation of the driving circuit for a semiconductor element of the invention having the construction above-mentioned, referring to a timing chart showing signals of the respective portions of the driving circuit for a semiconductor element of the invention shown in FIG. 5 at a time of normal operation, and to a timing chart of the same at the time when reverse bias current is generated.

At first, explanation will be given on the operation when the driving circuit is in the normal state.

As shown in FIG. 5(a), in the normal state where ON/OFF signal is inputted into the transistor 2 to be controlled at a constant interval, as shown in FIG. 5(b), reverse bias current $I_{B2}$ is flown for a minute time t0 (from 10 to 20 μsec.) just after reverse bias is applied to the transistor 2 to be controlled. Thereafter, as an impedance between the emitter and the base of the transistor 2 to be controlled becomes high, reverse bias current $I_{B2}$ flows only a little even in the reverse bias state, so can be neglected.

At this time, the level of reverse bias current $I_{B2}$ is high, however, as the duration thereof is extremely short, the reverse bias current $I_{B2}$ detected by the reverse bias current detecting circuit 25 through the electric field effect transistor 70 and the resistance 65 accompanying with conduction of the transistor 66 by the terminal voltage of the resistance 18 is removed by the first filter 21.

That is, the output of the first filter 21, as shown in FIG. 5(c), does not reach the first threshold TH1 of the first comparator 22, therefore the first comparator 22 does not output the signal.

Next, explanations will be given on the operation in the case where the output of the driving circuit 1 is short-circuited under reverse bias state.

The reverse bias current $I_{B2}$, as shown in FIG. 6(a) continues for relatively long time. Therefore, as shown in FIG. 6(b), the output of the first filter 21 exceeds the first threshold TH1 of the first comparator 22 after a time t1 has passed from a time point when the reverse bias current $I_{B2}$ begins to flow according to the discharge time constant of capacitor 64.

And, as shown in FIG. 6(c), as the first comparator 22 outputs a predetermined signal to the second filter 23, the output level, as shown in FIG. 6(d), of the second filter 23 gradually rises according to the time constant of the capacitor 62, and exceeds the second threshold TH2 of the second comparator 24 after a time t2 has passed.

After the output of the second filter 23 being the input to the second comparator 24 exceeds the second threshold TH2, as shown in FIG. 6(e), the output of the second comparator 24 changes from high-level to low-level, thereby the reverse bias current $I_{B2}$ is shut off. In other words, the second comparator 24 switches the reverse bias current $I_{B2}$ ON/OFF, that is, functions as a switch 30 shown in FIG. 2.

As the output of the second comparator 24 is inputted to the NOR gate 53 of the reverse bias current detecting circuit 25, the output of the first filter 21 being to be lowered at the same time when the reverse bias current is shut off, and the output level of the first filter 21 is lowered to be less than the first threshold TH1 of the first comparator 22 after a time t3 has passed. Accordingly, the output level of the second filter 23 being to be lowered after this point.

Here, when the discharge time constant of the second filter 23 is set to be relatively large by the resistances 55 and 56, diodes 57 through 61 and capacitor 62 so as not to bring about reverse bias operation after a time t4 has passed as shown in FIG. 6, the duty of the reverse bias current $I_{B2}$ becomes small. Then the off duration of the switch 30, that is, the duration when the output of the second comparator 24 is low level can be satisfactorily lengthened, thereby burnout of the circuit can be avoided.

In addition, in the above-described embodiment, explanation was given on the driving circuit for a semiconductor element for the transistor 2 to be controlled, however, the present invention can be applied to every semiconductor element to which reverse bias can be applied.

As described in the above, according to the driving circuit for a semiconductor element of the invention, even in the case where the output of the driving circuit is short-circuited due to breakage or miswiring the semiconductor element to be driven, it can be possible to protect transistors and the like constructing the driving circuit from burnout, accordingly, the driving circuit of high reliability can be obtained.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A driving circuit for a semiconductor element to be controlled, comprising:
    a first transistor and a second transistor being connected in series to selectively assume an ON-state responsive to application of forward or reverse bias;
    a first power source for supplying D.C. current to said first transistor;
    a second power source connected in series with said first power source for supplying D.C. current to said second transistor;
    a semiconductor element to be controlled and to be driven, whose base is connected to a series node of said first transistor and said second transistor and is supplied with forward bias current, and whose emitter is connected with a series node of said first power source and said second power source and is supplied with reverse bias current; and
    a reverse bias stop judging circuit, connected between said second transistor and said second power source, having:
    a detecting circuit, for detecting reverse bias current;
    level detecting means for detecting when said reverse bias current continuously exceeds a set level for a predetermined time according to a detected output of said detecting circuit; and
    means for temporarily stopping application of reverse bias to said semiconductor element to be controlled according to the detected output of said level detecting means and for restarting application of reverse bias to said semiconductor element after a predetermined time.

2. The driving circuit for a semiconductor element to be controlled as set forth in claim 1, wherein said semiconductor element to be controlled is a power transistor.

* * * * *